United States Patent
Hoke et al.

(10) Patent No.: US 6,620,662 B2
(45) Date of Patent: Sep. 16, 2003

(54) DOUBLE RECESSED TRANSISTOR

(75) Inventors: William E. Hoke, Wayland, MA (US); Katerina Y. Hur, Sunnyvale, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/836,663

(22) Filed: Apr. 17, 2001

(65) Prior Publication Data

US 2001/0023133 A1 Sep. 20, 2001

Related U.S. Application Data

(62) Division of application No. 09/504,660, filed on Feb. 14, 2000.

(51) Int. Cl.$^7$ .............................................. H01L 21/338
(52) U.S. Cl. ...................................................... 438/172
(58) Field of Search ................................ 438/172, 167, 438/175; 257/194, 195, 189, 192

(56) References Cited

U.S. PATENT DOCUMENTS

| | | |
|---|---|---|
| 5,060,030 A | 10/1991 | Hoke |
| 5,140,386 A | 8/1992 | Huang et al. |
| 5,270,228 A | 12/1993 | Ishikawa |

(List continued on next page.)

FOREIGN PATENT DOCUMENTS

JP    07193224    *  7/1995    ......... H01L/29/778

OTHER PUBLICATIONS

A. Katz, "Indium Phosphide and Related Materials: Processing, Technology, and Devices," © 1992, Artech House, Inc., Norwood MA 02062.

K. Y. Hur et al.; "Ultralinear double pulse doped AlInAs/GaInAs/InP HEMTs"; Electronics Letters, Aug. 1, 1996; vol. 32, No. 16; pp. 1516–1518.

Katerina Y. Hur et al.; "Development of Double Recessed AlInAs/GaInAs/InP HEMTs For Millimeter Wave Power Applications"; Solid–State Electronics; vol. 41, No. 10; 1997; pp. 1581–1585.

Tom P.E. Broekaert et al.; "AlAs Etch–Stop Layers for InGaAlAs/InP Heterostructure Devices and Circuits"; IEEE; Mar. 1992; vol. 39, No. 3; pp. 533–536.

Tom P.E. Broekaert et al.; "Novel, Organic Acid–Based Etchants for InGaAlAs/InP Heterostructure Device with AlAs Etch–Stop Layers"; J. Electrochem. Soc., vol. 139, No. 8; Aug. 1992; pp. 2306–2309.

P. Ho et al; "Extremely High Gain, Low Noise InAl/As/InGaAs HEMTs Grown By Molecular Beam Epitaxy"; IEEE; 1998; pp. 184–186.

C.S. Whelan et al.; "Low Noise $In_{0.32}(AlGa)_{0.68}As/In_{0.43}Ga_{0.57}As$ Metamorphic HEMT on GaAs Substrate with 850 mW/mm Output Power Density"; IEEE Electron Device Letters, vol. 21, No. 1; Jan. 2000; pp. 5–8.

Primary Examiner—William David Coleman
Assistant Examiner—Brook Kebede
(74) Attorney, Agent, or Firm—Daly, Crowley & Mofford, LLP

(57) ABSTRACT

A transistor structure is provided. This structure has a source electrode and a drain electrode. A doped cap layer of $Ga_xIn_{1-x}As$ is disposed below the source electrode and the drain electrode and provides a cap layer opening. An undoped resistive layer of $Ga_xIn_{1-x}As$ is disposed below the cap layer and defines a resistive layer opening in registration with the cap layer opening and having a first width. A Schottky layer of $Al_yIn_{1-y}As$ is disposed below the resistive layer. An undoped channel layer is disposed below the Schottky layer. A semi-insulating substrate is disposed below the channel layer. A top surface of the Schottky layer beneath the resistive layer opening provides a recess having a second width smaller than the first width. A gate electrode is in contact with a bottom surface of the recess provided by the Schottky layer.

33 Claims, 5 Drawing Sheets

U.S. PATENT DOCUMENTS

| | | |
|---|---|---|
| 5,285,087 A | 2/1994 | Narita et al. |
| 5,298,444 A | 3/1994 | Ristow |
| 5,300,795 A | 4/1994 | Saunier et al. |
| 5,364,816 A | 11/1994 | Boos et al. |
| 5,436,470 A | 7/1995 | Nakajima |
| 5,448,084 A | 9/1995 | Hoke et al. |
| 5,504,353 A | 4/1996 | Kuzuhara |
| 5,548,138 A | 8/1996 | Tanimoto et al. |
| 5,548,140 A | 8/1996 | Nguyen et al. |
| 5,550,388 A | 8/1996 | Haruyama |
| 5,596,211 A * | 1/1997 | Onda et al. ................. 257/194 |
| 5,641,977 A | 6/1997 | Kanamori |
| 5,663,583 A | 9/1997 | Matloubiian et al. |
| 5,668,387 A | 9/1997 | Streit et al. |
| 5,721,161 A | 2/1998 | Nguyen et al. |
| 5,734,670 A | 3/1998 | Ono et al. |
| 5,811,843 A | 9/1998 | Yamamoto et al. |
| 6,144,048 A | 11/2000 | Suemitsu et al. |
| 6,144,049 A * | 11/2000 | Onda ......................... 257/194 |
| 6,194,747 B1 | 2/2001 | Onda |
| 6,258,639 B1 * | 7/2001 | Rohdin et al. ............. 438/167 |
| 6,271,547 B1 * | 8/2001 | Hoke et al. ................. 257/192 |

* cited by examiner

DOUBLE RECESSED TRANSISTOR

RELATED PATENT APPLICATIONS

This is a divisional of patent application Ser. No. 09/504,660 filed Feb. 14, 2000.

BACKGROUND OF THE INVENTION

This invention relates generally to high electron mobility transistors (HEMTs) and more particularly to transistors of such type which are fabricated with a double recess.

As is known in the art, there are several types of active devices used at microwave and millimeter frequencies to provide amplification of radio frequency signals. In general, one of the more common semiconductor devices used at these frequencies is the high electron mobility transistor (HEMT). Typically, HEMTs are formed from Group III–V materials such as gallium arsenide (GaAs) or indium phosphide (InP). In a HEMT there is a doped donor/undoped spacer layer of one material and an undoped channel layer of a different material. A heterojunction is formed between the doped donor/undoped spacer layer and the undoped channel layer. Due to the conduction band discontinuity at the heterojunction, electrons are injected from the doped donor/undoped spacer layer into the undoped channel layer. Thus, electrons from the large bandgap donor layer are transferred into the narrow bandgap channel layer where they are confined to move only in a plane parallel to the heterojunction. Consequently, there is spatial separation between the donor atoms in the donor layer and the electrons in the channel layer resulting in low impurity scattering and good electron mobility.

One device which has been found to provide good device characteristics such as breakdown voltage, output currents, and pinch-off voltage is a double recessed HEMT. Such a device is fabricated with two aligned recesses in which the gate is formed. The recesses are typically formed by wet etching the device. For example, etching the recesses can include selective and non-selective etching. For non-selective etching, the process is periodically interrupted and the device is tested for certain characteristics, e.g., current. If the characteristics meet the desired criteria, then etching for the recess is terminated. Otherwise, the etching continues. This non-selective process continues until the recess meets the established criteria. This process takes time and money to repeatedly stop the etching and test the device. Also, the etching is not uniform across the wafer, resulting in inconsistent device characteristics across the wafer and low yield of acceptable devices on the wafer.

SUMMARY OF THE INVENTION

In accordance with the present invention, a transistor structure is provided. This structure has a source electrode and a drain electrode. A doped cap layer of $Ga_xIn_{1-x}As$ is disposed below and in ohmic contact with the source electrode and the drain electrode and provides a cap layer opening. An undoped resistive layer of $Ga_xIn_{1-x}As$ is disposed below the cap layer and provides a resistive layer opening in registration with the cap layer opening and having a first width. A Schottky layer of $Al_yIn_{1-y}As$ is disposed below the resistive layer. An undoped channel layer is disposed below the Schottky layer. A semi-insulating substrate is disposed below the channel layer. A top surface of the Schottky layer beneath the resistive layer opening provides a recess having a second width smaller than the first width. A gate electrode is in contact with a bottom surface of the recess provided by the Schottky layer.

With such structure, uniform device characteristics such as breakdown voltage, output currents, and pinch-off voltage are achievable, as is a high yield of acceptable devices.

In accordance with another feature of the invention, a semiconductor structure is provided having a Schottky layer adapted to be etched at a first etch rate by an etchant. The semiconductor structure also has a contact layer disposed above the Schottky layer and adapted to be etched by the etchant at a second etch rate that is substantially faster than the first etch rate. The contact layer provides an opening exposing a region of a top surface of the Schottky layer, the region having a first width. The region of the top surface of the Schottky layer provides a recess of a second width smaller than the first width.

In a preferred embodiment of the invention, the Schottky layer contains aluminum, with an etch rate of about 0.1 Å/second relative to a succinic acid etchant, while the contact layer is substantially free of aluminum, having an etch rate of about 5 Å/second relative to succinic acid etchant. Such composition allows the transistor's contact layer to be selectively etched with succinic acid to form the opening while leaving the Schottky layer substantially intact. Thus, uniform device characteristics such as breakdown voltage, output currents, and pinch-off voltage can be achieved and a high yield of acceptable devices produced.

In accordance with another feature of the invention, a transistor structure is provided having a Schottky layer adapted to be etched at a first etch rate by an etchant and a contact layer disposed above the Schottky layer and adapted to be etched by the etchant at a second etch rate that is substantially faster than the Schottky layer's first etch rate. In this structure, a region above a portion of a top surface of the Schottky layer is substantially free of the contact layer. The portion of the top surface of the Schottky layer has a first width and provides a recess having a second width smaller than the first width and adapted to receive a gate electrode.

In a preferred embodiment of the invention, the Schottky layer comprises at least about 35 percent Aluminum and the contact layer comprises less than about ten percent Aluminum.

In accordance with another feature of the invention, a double recessed, strain compensated transistor structure is provided. The semiconductor structure has a substrate, a strain compensating layer disposed above the substrate, and a Schottky layer disposed above the strain compensating layer. The substrate and the layers have mismatched lattice constants.

In a preferred embodiment of the invention, the Schottky layer comprises about 60 percent aluminum and about 40 percent indium, and the strain compensating layer comprises about 35 percent gallium and 65 percent indium.

In accordance with another feature of the invention, a method of forming a semiconductor is provided. The method includes forming a Schottky layer adapted to be etched by a first etchant at a first etch rate and forming a contact layer above the Schottky layer adapted to be etched by the first etchant at a second etch rate that is substantially faster than the first etch rate. The first etchant is applied to etch the contact layer to expose a portion of the Schottky layer. A second etchant is applied to etch the portion of the Schottky layer exposed by the first etchant.

In a preferred embodiment of the invention, the Schottky layer contains Aluminum while the contact layer is substantially free of Aluminum. Further, the first etchant includes a carboxylic-acid based wet etchant.

Embodiments of the invention may provide one or more of the following advantages. The invention saves time and money in manufacturing HEMTs. It also decreases the need to etch a device and periodically test the device for certain characteristics. Uniformity of device characteristics on a wafer can be improved.

Other advantages will be apparent from the following description and from the claims.

DESCRIPTION OF PREFERRED EMBODIMENTS

Figure 1:
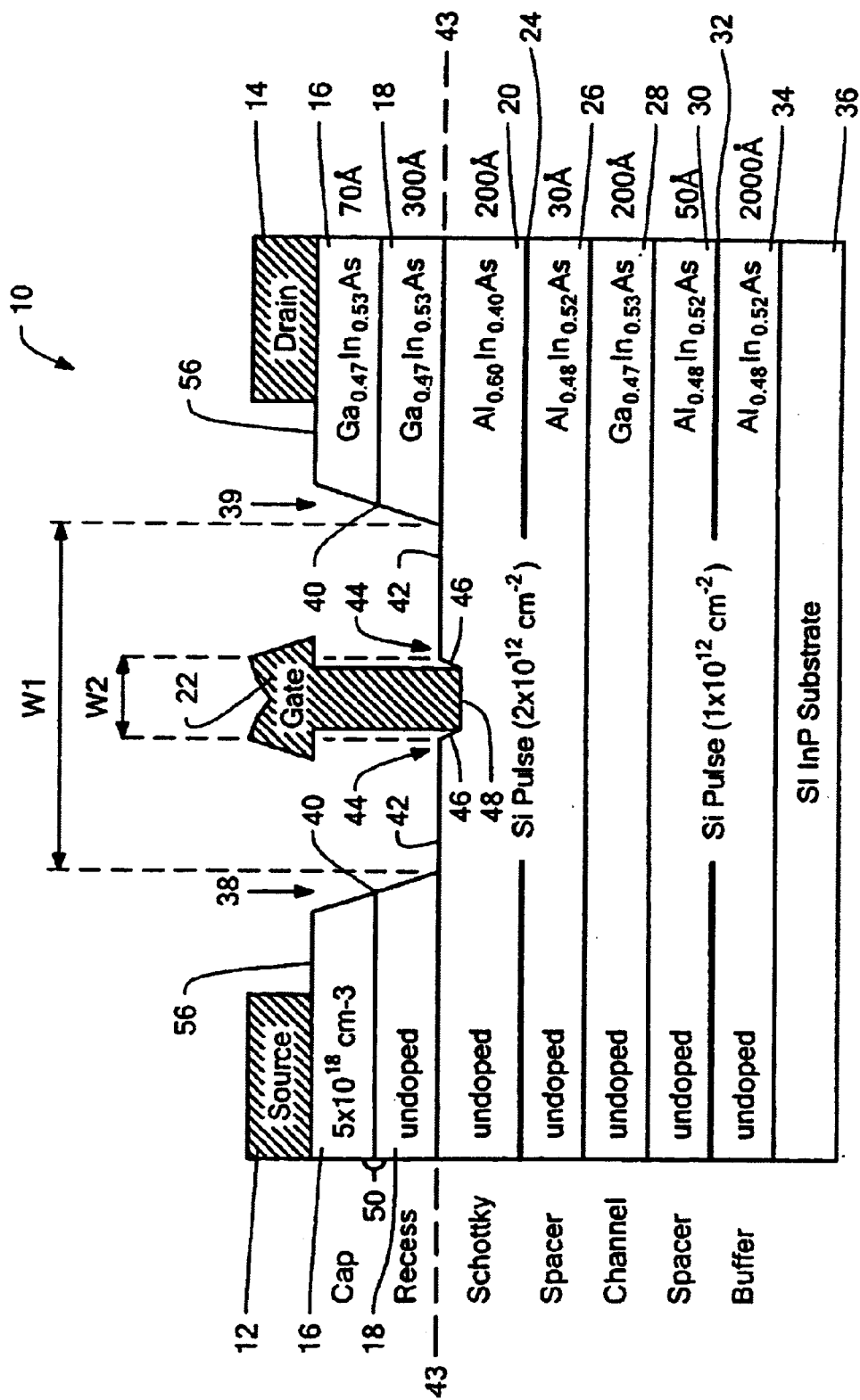
FIG. 1 is a cross sectional diagrammatical sketch of a double recessed HEMT according to the invention.

Referring now to FIG. 1, a high electron mobility transistor (HEMT) 10 is shown. Here, transistor 10 has a source electrode 12 and a drain electrode 14. The electrodes 12 and 14 are in ohmic contact with a cap layer 16. The cap layer 16 here is $Ga_{0.47}In_{0.53}As$, about 70 D thick, and has a doping concentration of about $5\times10^{18}$ cm$^{-3}$. Disposed below the cap layer 16 is a recess or resistive layer 18. The resistive layer 18 here is $Ga_{0.47}In_{0.53}As$, about 300 D thick, and undoped. The cap and resistive layers 16 and 18 form a contact layer 50. Disposed below the resistive layer 18 is a Schottky layer 20, here undoped $Al_{0.60}In_{0.40}As$ about 200 D thick. The cap and resistive layers 16, 18 provide an opening 38 from a surface 56 to a top surface 42 of the Schottky layer 20. The top surface 42 of the Schottky layer 20 provides a recess 44 with a bottom surface 48. In Schottky contact with the Schottky layer 20 at the bottom surface 48 is a gate electrode 22. A doped pulse layer 24 is disposed below the Schottky layer 20. Here the pulse layer 24 is silicon and has a doping concentration of about $2\times10^{12}$ cm$^{-2}$. Disposed below the pulse layer 24 is a spacer layer 26. The spacer layer 26 here is $Al_{0.48}In_{0.52}As$, about 30 D thick, and undoped. Disposed below the spacer layer 26 is a channel layer 28. The channel layer 28 here is $Ga_{0.47}In_{0.53}As$, about 200 D thick, and undoped. A second spacer layer 30 is disposed below the channel layer 28. Here the spacer layer 30 is $Al_{0.48}In_{0.52}As$, about 50 D thick, and undoped. Disposed below the spacer layer 30 is a second pulse layer 32. Here the pulse layer 32 is silicon and has a doping concentration of $1\times10^{12}$ cm$^{-2}$, providing a silicon pulse ratio of 2:1 between the first pulse layer 24 and the second pulse layer 32 to help linearize the performance of the transistor 10. Disposed below the pulse layer 32 is a buffer layer 34. The buffer layer 34 here is $Al_{0.48}In_{0.52}As$, about 2000 D thick, and undoped. Disposed below the buffer layer 34 is a semi-insulating InP substrate 36.

The Schottky layer 20 can be undoped, as shown, or doped. An undoped Schottky layer provides a higher breakdown voltage than with a doped Schottky layer 20. A doped Schottky layer 20 reduces resistance which lowers the breakdown voltage and increases conduction compared to an undoped Schottky layer 20.

As shown, transistor 10 has a double recess structure including a first recess 39, formed by the opening 38 and the top surface 42 of the Schottky layer 20, and the second recess 44. The first recess 39 is provided by the cap layer 16 and the resistive layer 18. Side walls 40 of the first recess 39 are provided by the cap and resistive layers 16, 18 from the surface 56 to the top surface 42 of the Schottky layer 20. The first recess 39 exposes a first width W1 of the Schottky layer 20 at a top level 43 of the Schottky layer 20. The second recess 44 has a second width W2 at the bottom surface 48, the width W2 being smaller than the width W1. The second recess 44 is provided by the top surface 42 of the Schottky layer 20 and has side walls 46 extending from the top 43 of the Schottky layer 20 to the bottom surface 48.

The cap and resistive layers 16, 18 have different material composition than the Schottky layer 20. The Schottky layer 20 includes Group III–V material, here aluminum and indium. Sixty percent of the Group III material in the Schottky layer 20 is aluminum and forty percent is indium. To provide desirable device characteristics, there is preferably at least 35 percent aluminum in the Schottky layer 20, and less than about ten percent aluminum in the cap and resistive layers 16, 18. The cap and resistive layers 16, 18 are preferably substantially free of Aluminum, though they can contain up to about ten percent Aluminum and still provide desirable device characteristics.

The cap and resistive layers 16, 18 have a different etch rate than the Schottky layer 20 to provide etch selectivity. The Schottky layer 20 is adapted to be etched at a first etch rate by an etchant. The $Al_{0.60}In_{0.40}As$ Schottky layer 20 shown has an etch rate of about 0.1 Å/second when exposed to an etchant of succinic acid, which is a carboxylic-acid based wet etchant. The cap and resistive layers 16, 18 are adapted to be etched by the etchant at a second etch rate that is substantially faster than the first etch rate. The $Ga_{0.47}In_{0.53}As$ layers 16, 18 have etch rates of about 5 Å/second when etched by succinic acid.

Figure 2:
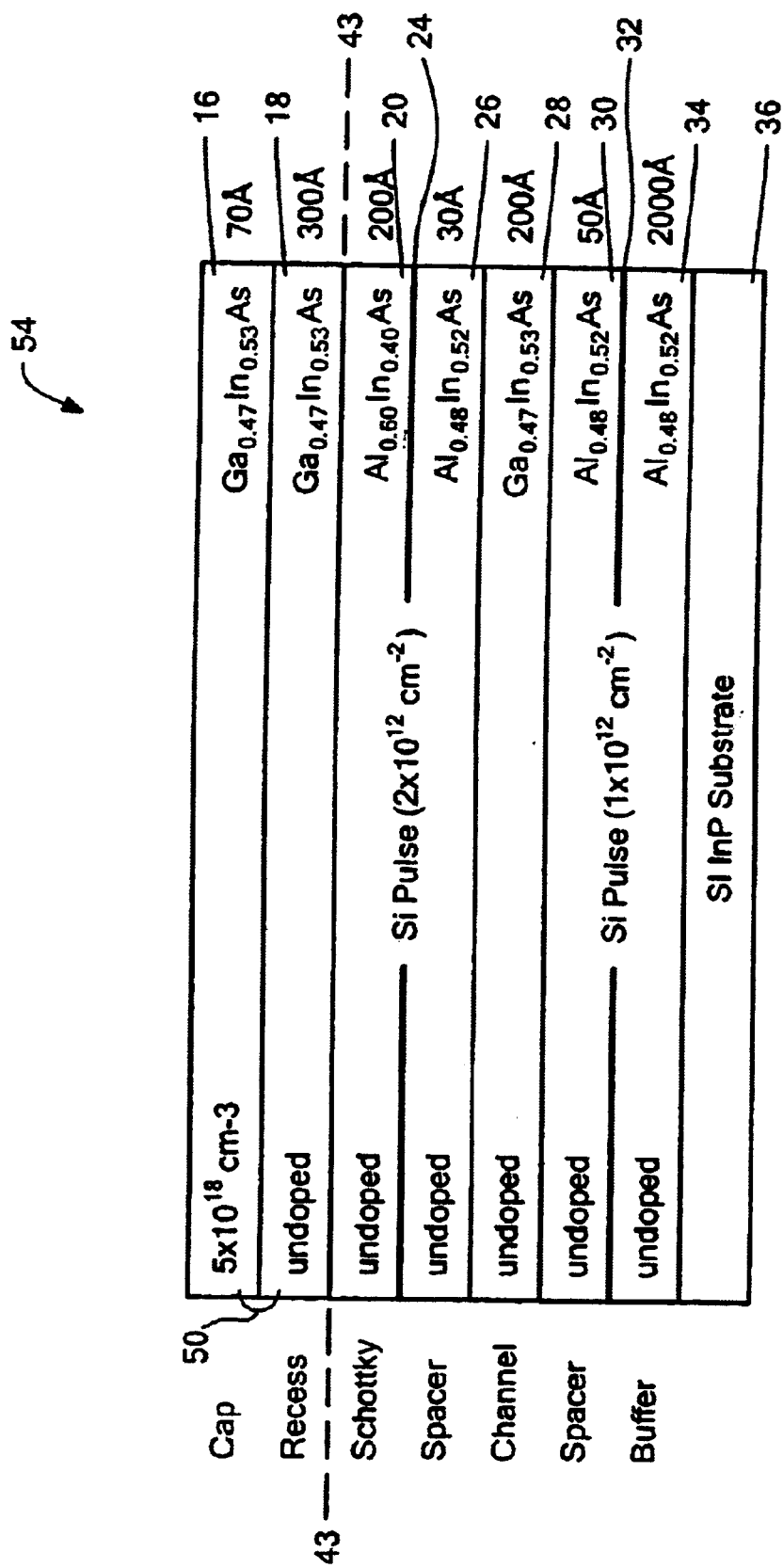
FIGS. 2–4 are cross sectional diagrammatical sketches of the double recessed HEMT of FIG. 1 in various stages of manufacture.
Figure 3:
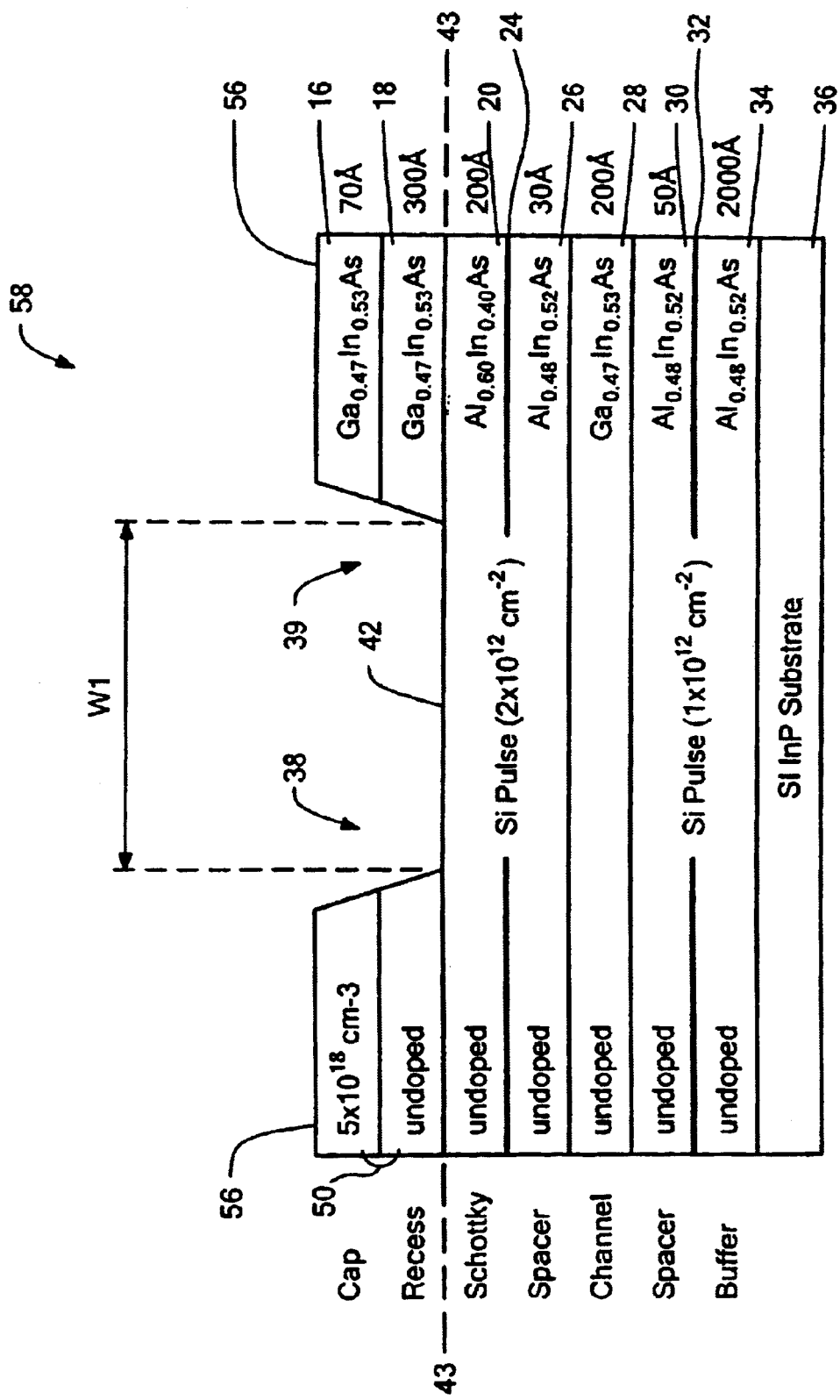
Figure 4:
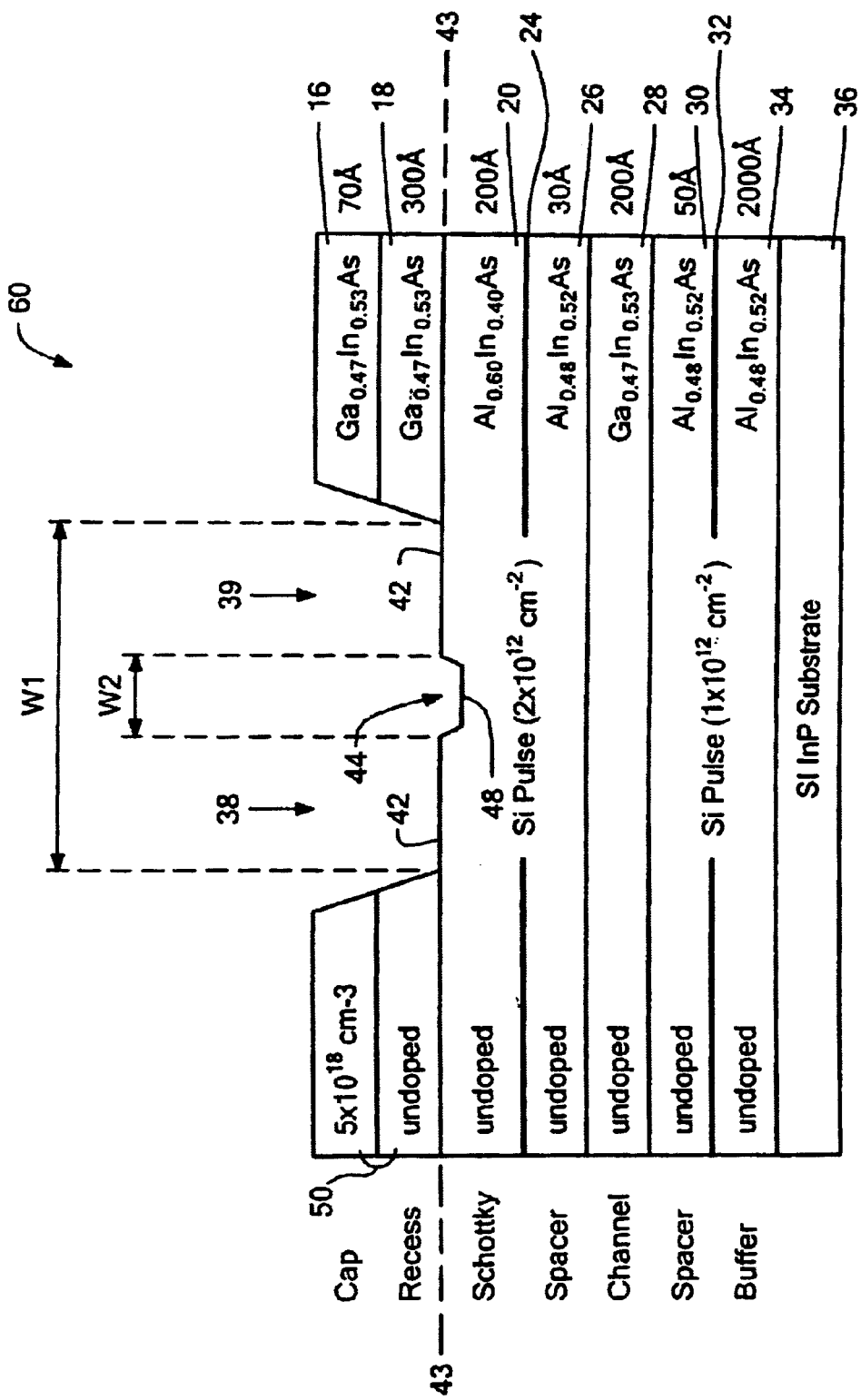

A method of forming a semiconductor device such as transistor 10 is now described, referring to FIGS. 1–4. FIG. 2 shows the forming of layers 16, 18, and 20. FIGS. 3 and 4 show the etching of layers 16, 18, and 20. FIG. 1 shows the finished transistor 10.

The method of forming transistor 10 in FIG. 1 includes forming the Schottky layer 20 and the cap and resistive layers 16, 18 above the Schottky layer 20. An etchant is applied to the cap and resistive layers 16, 18 to etch them and expose the top surface 42 of the Schottky layer 20. Another etchant is applied to etch the exposed top surface 42 of the Schottky layer 20 to produce the recess 44.

Referring to FIG. 2, forming the semiconductor layers 16, 18, and 20 is now described. As shown in FIG. 2, the substrate 36 is provided and the buffer layer grown on the substrate 36 by suitable techniques such as molecular beam epitaxy (MBE) and metal-organic chemical vapor deposition (MOCVD). Over the buffer layer 34 the pulse layer 32 is grown by MBE and doped by silicon. Over the pulse layer 32 the spacer layer 30, the channel layer 28, and the spacer layer 26 grown by MBE. Over the spacer layer 26 the pulse layer 24 is grown by MBE and doped by silicon. Over the pulse layer 24 the Schottky layer 20 is grown by MBE. Referring now to FIG. 3, the contact layer 50, including the cap layer 16 and the resistive layer 18, is formed by MBE on the Schottky layer 20 to complete the formation of an intermediate structure 54. A wet etch process for mesa isolation is performed by applying 1:8:160 $H_2SO_4:H_2O_2:H_2O$ for about 20 seconds to define the mesa. Then, 6:1 succinic acid:$H_2O_2$ is applied for about 90 seconds to selectively etch is back the InGaAs channel layer 28. This forms a channel notch (not shown) to help prevent shorting of the channel layer 28 to the gate electrode 22 via a conductor (not shown) running up the side of the mesa.

Referring to FIGS. 3 and 4, etching the intermediate structure 54 is now described. As shown in FIG. 3, a first etchant, here a carboxylic-acid based wet etchant, specifically 6:1 succinic acid:$H_2O_2$ is applied to the top surface 56 of the cap layer 16. Electron beam lithography is used with the succinic acid and the succinic acid is applied for enough time, e.g., about 60 seconds, to etch the contact layer 50 at the second etch rate to form the opening 38. This exposes the top surface 42 of the Schottky layer 20, selectively forms the first recess 39, and completes the formation of an intermediate structure 58. Because the first etch rate of the Schottky layer 20 is substantially slower than the second etch rate of the contact layer 50 in response to the succinic acid, the succinic acid essentially does not etch the Schottky layer 20. The first etch is a selective etch.

Now referring to FIG. 4, intermediate structure 58 is etched. A second etchant, e.g., 1:1:100 $H_3PO_4$:$H_2O_2$:$H_2O$ is applied to a portion of the top surface 42 of the Schottky layer 20 exposed by the succinic acid for enough time to etch the Schottky layer 20, e.g., 10 seconds. This etching forms the second recess 44, and completes the formation of intermediate structure 60.

Referring to FIG. 1, electrodes 12, 14, and 22 are added to the intermediate structure 60 to complete the transistor 10. The source and drain electrodes 12 and 14 are in ohmic contact with the top surface 56 of the cap layer 16. These ohmic contacts for the source and drain electrodes 12 and 14 are fabricated using a 900 D AuGe—2000 D Au metallurgy at 375 EC. The gate electrode 22 is in Schottky contact with the bottom surface 48 of the Schottky layer 20. The gate recess is formed by depositing a resist layer, not shown. The resist is developed and removed according to known methods (e.g., by exposing a photoresist, removing the photoresist), and then the recess is formed by etching the semiconductor. Schottky metal of 500 Å Ti—500 Å Pt—4000 Å Au is deposited over the resist layer on the recess 44. The resist layer is lifted off to remove unwanted metal, leaving the gate electrode 22.

The transistor 10 shown in FIG. 1 has been fabricated and tested. The transistor 10 had a typical carrier sheet density of about $3 \times 10^{12}$ cm$^{-2}$, Hall mobility of 8300 cm$^2$/V-sec at room temperature, maximum output current in the range 590–640 mA/mm, and breakdown voltage in the range 12.3–14.4 V.

Figure 5:
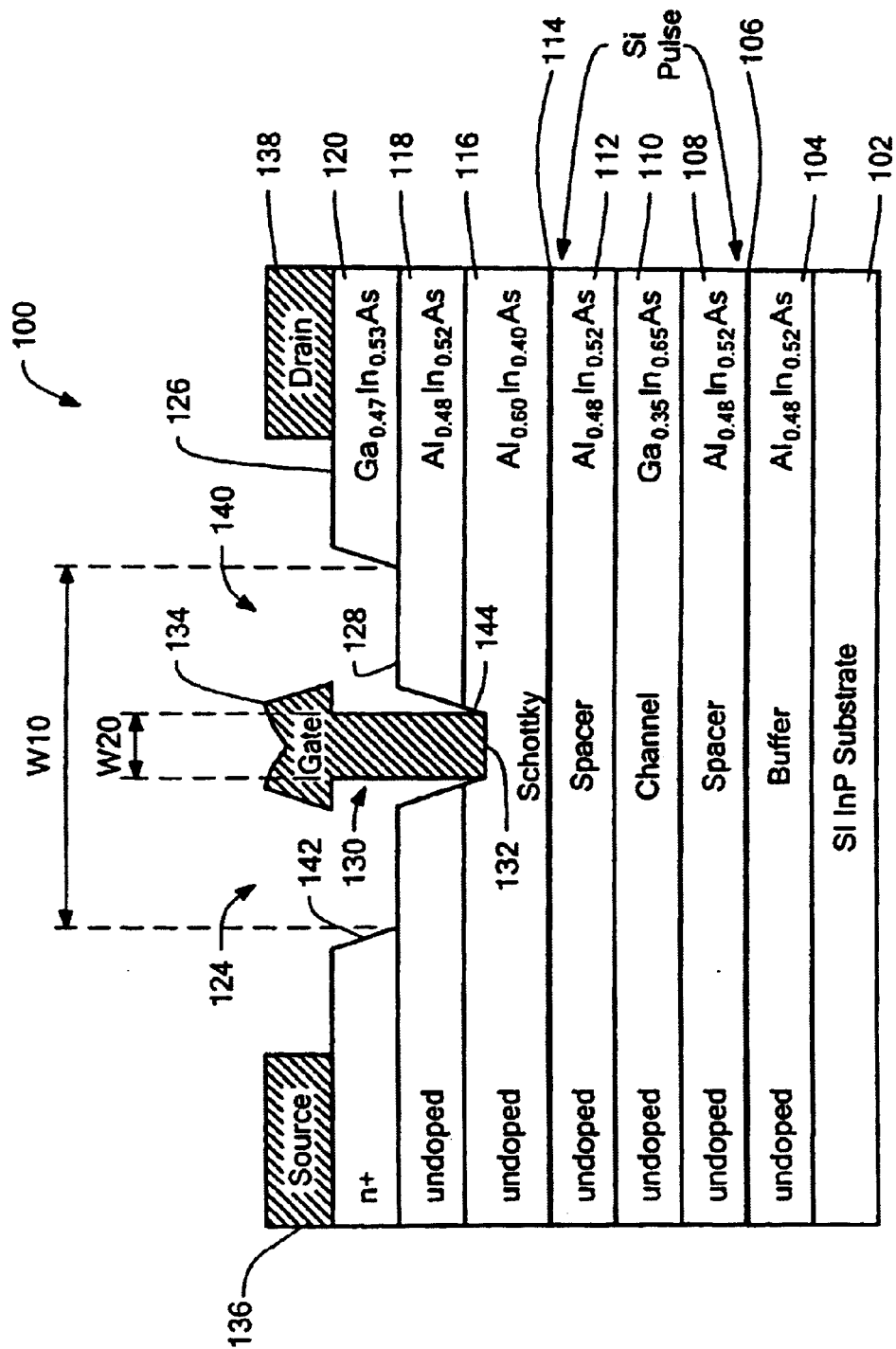
FIG. 5 is a cross sectional diagrammatical sketch of a double recessed, strain compensated HEMT according to the invention.

In another embodiment of the invention, referring now to FIG. 5, a double recessed, strain compensated HEMT is s provided. The HEMT 100 includes a semi-insulating, single crystal InP substrate 102. The substrate 102 has an inherent lattice constant. Disposed above the substrate 102 is an undoped buffer layer 104 lattice matched to the substrate 102. The buffer layer 104 here is $Al_{0.48}In_{0.52}As$, having a thickness of 1,500–5,000 Å, typically about 2000 Å. Disposed above the buffer layer 104 is a first pulse layer 106, also called a ä-doped or pulse doped layer. The pulse layer 106 is silicon and has a doping concentration of $0.5 \times 10^{12}$–$2 \times 10^{12}$ cm$^{-2}$, typically $1 \times 10^{12}$ cm$^{-2}$. Disposed above the first pulse layer 106 is a first spacer layer 108. The first spacer layer 108 is $Al_{0.48}In_{0.52}As$, having a thickness of 30–50 Å, preferably about 50 Å thick, and undoped.

Disposed over the first spacer layer 108 is the channel layer 110 having an inherent lattice constant. The lattice constant of the channel layer 110 is different than the lattice constant of the substrate 102. The channel layer 110 serves as a strain compensation layer, comprised of a material which will develop an inherent or intrinsic compressive strain when grown over the first spacer layer 108 due to lattice constant mismatch between the channel layer 110 and the substrate 102. Here, the material used for the channel layer 110 is $Ga_{1-x}In_xAs$, with an indium concentration, x, of 0.53–0.70, preferably 0.60–0.65. The channel layer 110 has a thickness of 50–400 Å, preferably about 200 Å thick, and is undoped. The thickness of the channel layer 110 is a function of the indium concentration in the channel layer 110, since the indium concentration in the channel layer 110 affects the lattice constant (and strain) of the channel layer 110. As the indium concentration changes, the lattice constant of the channel layer also changes, thereby affecting the degree of lattice mismatch between the channel layer 110 and other layers in the HEMT 100. The greater the lattice mismatch, the thinner the channel layer 110 will be to avoid dislocations in the channel layer 110. In general, the composition and thickness of the channel layer 110 is selected to provide a layer having an intrinsic compressive stress which substantially compensates for intrinsic tensile stress of a Schottky layer 116 disposed over the channel layer 110, as described below. The thickness and indium is concentration of the channel layer 110 are selected to maximize that compensating effect while avoiding dislocations in the channel layer 110, and consequently do not exceed the elastic strain limits of the channel layer 110.

First, disposed above the channel layer 110 is a second spacer layer 112. The second spacer layer 112 here is $Al_{0.48}In_{0.52}As$, about 30–50 Å thick, and undoped. Disposed above the second spacer layer 112 is a second pulse layer 114, also called a ä-doped or pulse doped layer. The second pulse layer 114 is silicon and has a doping concentration of about $2 \times 10^{12}$–$4 \times 10^{12}$ cm$^{-2}$, preferably $3 \times 10^{12}$ cm$^{-2}$, typically providing a ratio of doping concentrations between the first pulse layer 106 and the second pulse layer 114 of approximately 2.5 to 1.5 to help linearize performance of the transistor 100.

Disposed above the second pulse layer 114 is the Schottky layer 116 having an inherent lattice constant. The lattice constant of the Schottky layer 116 is different than the lattice constants of the channel layer 110 and of the substrate 102. That is, these three layers are not lattice matched. Typically, the lattice constant of the Schottky layer 116 is smaller than the lattice constant of the substrate 102, and the lattice constant of the channel layer 110 is larger than the lattice constant of the substrate 102. Here, the Schottky layer 116 is $Al_{1-x}In_xAs$ with an aluminum concentration, 1-x, of 0.55–0.65, preferably 0.60. The Schottky layer 116 has a thickness of 50–400 Å, preferably about 200 Å thick, and is undoped. The thickness of the Schottky layer 116 will depend on the indium concentration in the Schottky layer 116. As the indium concentration changes, the lattice constant (and strain) of the Schottky layer also changes. Similar to the channel layer 110, the thickness and indium concentration of the Schottky layer 116 are balanced and maximized while avoiding dislocations due to lattice mismatch. Here, the Schottky layer 116 is undoped. An undoped Schottky layer provides a higher breakdown voltage than with a doped Schottky layer. A doped Schottky layer reduces resistance which lowers the breakdown voltage and increases conduction compared to an undoped Schottky layer. The growth of the Schottky layer provides a layer having tensile strain due to the lattice mismatch between the Schottky layer 116 and the underlying layers.

By disposing the channel or strain compensation layer 110 between the buffer layer 104 and the Schottky layer 116, the Schottky layer 116 may be grown to a larger thickness than if the Schottky layer 116 were grown directly on the buffer layer 104. Alternatively, the aluminum concentration in the Schottky layer 116 may be increased or any combination of the aforementioned arrangements may be provided to form the Schottky layer. Insertion of the channel layer 110 permits a thicker Schottky layer 116 or alternatively a higher concentration of aluminum in said Schottky layer 116 before the Schottky layer 116 reaches a sufficiently high enough tensile strain to cause dislocations in the crystal lattice of said Schottky layer 116. With the above arrangement, the channel layer 110 is grown to a thickness approaching, but not exceeding, a critical thickness of the channel layer 110. The Schottky layer 116 is grown over the channel layer 110. The initial growth of the Schottky layer 116 would provide a layer having tensile strain which would be compensated for by the compressive strains in the underlying channel layer 110. After the Schottky layer 116 is grown to a first thickness of zero net strain (i.e. compensated for by the compressive strain of the channel layer), the Schottky layer 116 is grown to an additional thickness until the Schottky layer additional thickness reaches a so-called critical thickness of the layer. By either incorporating additional aluminum into the Schottky layer 116 or by increasing the thickness of the Schottky layer 116, a higher bandgap for breakdown is achieved. Similarly, the tensile strain in the Schottky layer 116 stabilizes the high indium concentration in the channel layer 110. High indium concentration permits higher electron mobility and higher electron saturation velocity, thereby improving the overall performance of the HEMT 100 and permitting the HEMT 100 to handle larger amount of currents and thus power at higher frequencies. Further, an increase in aluminum concentration in the Schottky layer 116 and/or a higher indium concentration in the channel layer 110 increases the conduction band discontinuity between the Schottky 116 and channel 110 layers. This increases the current sheet density which also improves power performance.

Disposed over the Schottky layer 116 is a resistive layer 118. The resistive layer 118 here is $Al_{0.48}In_{0.52}As$, about 50–400 Å thick, typically 200 Å thick, and undoped. Disposed over the resistive layer 118 is a contact layer 120. The contact layer 120 here is $Ga_{0.47}In_{0.53}As$, about 100–500 Å thick, typically 70 Å thick, and has a doping concentration of about $3 \times 10^{18}$–$5 \times 10^{19}$ cm$^{-3}$.

The contact and resistive layer 120, 118 provide an opening 124 from a surface 126 to a top surface 128 in the resistive layer 118. The top surface 128 provides a recess 130 with a bottom surface 132. In Schottky contact with the Schottky layer 116 at the bottom surface 132 is a gate electrode 134. The transistor 100 has a source electrode 136 and a drain electrode 138. The electrodes 136 and 138 are in ohmic contact with a cap layer 120.

As shown in FIG. 5, transistor 100 has a double recess structure including a first recess 140, formed by the opening 124 and the top surface 128, and the second recess 130. The first recess 140 is provided by the contact layer 120 and the top of the resistive layer 118. Side walls 142 of the first recess 140 are provided by the contact layer 120. The first recess 140 exposes a first width W10 of the resistive layer 118. The second recess 130 has a second width W20 at the bottom surface 132, the width W20 being smaller than the width W10. The second recess 130 is provided by the top surface 128 of the resistive layer 118 and has side walls 144 extending from the top surface 128 to the bottom surface 132 in the Schottky layer 116.

The recesses are fabricated by selective and non-selective wet etching. Typically, the first recess is fabricated by selective etching, with the resistive layer 118 acting as an etching stop. The second recess is fabricated by non-selective etching. The wet etching for mesa isolation with a channel notch consists of a 20 sec. etch in 1:8:160 $H_2SO_4:H_2O_2:H_2O$ and a 90 sec. etch in a 6:1 succinic acid:$H_2O_2$ etchant. Ohmic contacts for source and drain pads are fabricated using a 900 Å AuGe–2000 Å Au metallurgy and 375 EC alloy furnace. A succinic acid etchant and a 1:1:100 $H_3PO_4:H_2O_2:H_2O$ etchant are used for the first recess and a gate etch, respectively. After the gate recess etch, Schottky metal consisting of 500 Å Ti—500 Å Pt—4000 Å Au is deposited and lifted off.

The strain compensated, double recessed HEMT 100 shown in FIG. 5 has been fabricated and tested. The tensile strain in the Schottky layer 116 is compensated by the compressive strain in the channel layer 110. This strain compensation allows the Schottky layer 116 to be grown thicker or to be grown with higher aluminum concentration than if the Schottky layer were lattice matched with the underlying layers. The use of higher indium concentration in the channel layer 110, because of strain compensation in the Schottky layer 116, increases the unity current gain cutoff frequency. Because of the larger conduction band discontinuity between the Schottky 116 and channel 110 layers (than had the layers been lattice matched), high output currents are obtained. Low breakdown voltages from the high indium concentration in the channel layer 110 are alleviated by the use of a double recessed gate process. The transistor 100 exhibits high output current (690–850 mA/mm) and high breakdown voltages (9–11 V) simultaneously. Due to the high indium concentration in the channel, the peak unity current gain cutoff frequency approaches 200 GHz and 160 GHz for devices with first recess widths of 0.8 ìm and 1.2 ìm, respectively. Typical carrier sheet density is $4 \times 10^{12}$ cm$^{-2}$ and Hall mobility is 9600 cm$^2$/V-sec at room temperature.

Other embodiments are within the spirit and scope of the appended claims. For example, the contact layer 50 can be a single layer, doped or undoped.

What is claimed is:

1. A method for forming a transistor, comprising:

providing a single crystal substrate having a lattice constant;

forming a channel layer disposed over the substrate, the channel layer having a lattice constant different from the lattice constant of the substrate;

forming a Schottky layer over the channel layer, the Schottky layer having a lattice constant different from the lattice constant of the substrate;

forming a resistive layer disposed over the Schottky layer;

forming a contact layer over the resistive layer with the contact layer having a first recess therein, such first recess having a bottom surface terminating in a top surface of the resistive layer; and forming a second recess having sidewalls in the resistive layer and the Schottky layer, such second recess having a bottom surface terminating in the Schottky layer.

2. The method recited in claim 1 wherein the lattice constant of the Schottky layer and a thickness of the Schottky layer are selected to compensate for differences in strain between: (a) the channel layer and the substrate; and, (b) the Schottky layer and the substrate.

3. The method recited in claim 2 wherein the lattice constant of the Schottky layer is smaller than the lattice constant of the substrate and the lattice constant of the channel layer is larger than the lattice constant of the substrate.

4. The method transistor recited in claim 3 wherein the lattice constant of the substrate is intermediate the lattice constant of the channel layer and the lattice constant of the Schottky layer, the difference in lattice constants resulting in a compressive strain on the channel layer and a tensile strain on the Schottky layer.

5. The method recited in claim 1 wherein the Schottky layer has an indium concentration and the indium concentration in the Schottky layer is lower than an indium concentration in the channel layer.

6. The method recited in claim 5 wherein the substrate comprises indium phosphide.

7. The method recited in claim 5 wherein the Schottky layer comprises approximately $Al_{0.60}In_{0.40}As$.

8. The method recited in claim 5 wherein the channel layer comprises approximately $Ga_{0.35}In_{0.65}As$.

9. The method recited in claim 6 wherein the Schottky layer comprises approximately $Al_{0.60}In_{0.40}As$ and the channel layer comprises approximately $Ga_{0.35}In_{0.65}As$.

10. A method for forming a transistor, comprising;
providing a substrate having a lattice constant;
providing a channel layer over the substrate, the channel layer having a lattice constant;
providing a Schottky layer over the channel layer, the Schottky layer having a lattice constant;
providing a resistive layer disposed over the Schottky layer;
providing a contact layer disposed over the resistive layer, the contact layer having a first recess therein, such first recess having a bottom surface terminating in a top surface of the resistive layer;
providing a second recess having sidewalls in the resistive layer and the Schottky layer, such second recess having a bottom surface terminating in the Schottky layer; and
wherein at least one of the channel and Schottky layers has an indium concentration such that both the lattice constants of the channel layer and lattice constant of the Schottky layer are different from the lattice constant of the substrate and a difference between conduction band levels of the channel and Schottky layers is larger than if the channel and Schottky layers had the same lattice constant as the substrate.

11. The method recited in claim 10 wherein the larger conduction band discontinuity occurs between the Schottky and channel layers.

12. The method recited in claim 10 wherein the Schottky layer comprises approximately $Al_{0.60}In_{0.40}As$ and the channel layer comprises approximately $Ga_{0.35}In_{0.65}As$.

13. The method recited in claim 8 wherein the channel layer has an indium concentration such that the channel layer can support larger currents than if the channel layer and the substrate had the same lattice constant.

14. A method for forming a transistor, comprising:
providing a semi-insulating indium phosphide substrate, such substrate having a lattice constant;
forming a channel layer of $Ga_xIn_{1-x}As$ over the substrate, such channel layer being formed with a lattice constant different from the lattice constant of the substrate;
forming a Schottky layer of $Al_yIn_{1-y}As$ over the channel layer;
forming a resistive layer disposed over the Schottky layer;
forming a contact layer over the resistive layer; the contact layer having a first recess, and the resistive layer and the Schottky layer having a second recess;
forming a source electrode in ohmic contact with the contact layer;
forming a drain electrode in ohmic contact with the contact layer; and
forming a gate electrode in Schottky contact with the Schottky layer.

15. The method recited in claim 14 further comprising forming the transistor with a first doped layer, and a second doped layer.

16. The method recited in claim 15 further comprising forming a ratio of silicon doping concentration approximately 2.5 to 1.5 between the first doped layer and the second doped layer.

17. The method recited in claim 15 wherein forming the resistive layer further comprises forming such layer with approximately $Al_{0.48}In_{0.52}As$ and forming the contact layer further comprises forming such layer with approximately $Ga_{0.47}In_{0.53}As$.

18. A method for forming a transistor, comprising:
providing a single crystal substrate having a lattice constant;
forming a channel layer disposed over the substrate, the channel layer having a lattice constant different from the lattice constant of the substrate;
forming a Schottky layer over the channel layer, the Schottky layer having a lattice constant different from the lattice constant of the substrate;
forming a contact layer above the Schottky layer with the contact layer having a first recess therein; and
forming a second recess aligned with the first recess, such second recess having a bottom surface terminating in the Schottky layer.

19. The method recited in claim 18 wherein the lattice constant of the Schottky layer and a thickness of the Schottky layer are selected to compensate for differences in strain between: (a) the channel layer and the substrate; and, (b) the Schottky layer and the substrate.

20. The method recited in claim 19 wherein the lattice constant of the Schottky layer is smaller than the lattice constant of the substrate and the lattice constant of the channel layer is larger than the lattice constant of the substrate.

21. The method transistor recited in claim 20 wherein the lattice constant of the substrate is intermediate the lattice constant of the channel layer and the lattice constant of the Schottky layer, the difference in lattice constants resulting in a compressive strain on the channel layer and a tensile strain on the Schottky layer.

22. The method recited in claim 18 wherein the Schottky layer has an indium concentration and the indium concentration in the Schottky layer is lower than an indium concentration in the channel layer.

23. The method recited in claim 22 wherein the substrate comprises indium phosphide.

24. The method recited in claim 22 wherein the Schottky layer comprises approximately $Al_{0.60}In_{0.40}As$.

25. The method recited in claim 22 wherein the channel layer comprises approximately $Ga_{0.35}In_{0.65}As$.

26. The method recited in claim 23 wherein the Schottky layer comprises approximately $Al_{0.60}In_{0.40}As$ and the channel layer comprises approximately $Ga_{0.35}In_{0.65}As$.

27. A method for forming a transistor, comprising;
providing a substrate having a lattice constant;
providing a channel layer over the substrate, the channel layer having a lattice constant;
providing a Schottky layer over the channel layer, the Schottky layer having a lattice constant;
providing a contact layer disposed above the Schottky layer, the contact layer having a first recess therein;
providing a second recess aligned with the first recess, such second recess having a bottom surface terminating in the Schottky layer; and wherein at least one of the channel and Schottky layers has an indium concentration such that both the lattice constants of the channel layer and lattice constant of the Schottky layer are different from the lattice constant of the substrate and a difference between conduction band levels of the channel and Schottky layers is larger than if the channel and Schottky layers had the same lattice constant as the substrate.

28. The method recited in claim 27 wherein the larger conduction band discontinuity occurs between the Schottky and channel layers.

29. The method recited in claim 27 wherein the Schottky layer comprises approximately $Al_{0.60}In_{0.40}As$ and the channel layer comprises approximately $Ga_{0.35}In_{0.65}As$.

30. The method recited in claim 25 wherein the channel layer has an indium concentration such that the channel layer can support larger currents than if the channel layer and the substrate had the same lattice constant.

31. A method for forming a transistor, comprising:

providing a semi-insulating indium phosphide substrate, such substrate having a lattice constant;

forming a channel layer of $Ga_xIn_{1-x}As$ over the substrate, such channel layer being formed with a lattice constant different from the lattice constant of the substrate;

forming a Schottky layer of $Al_yIn_{1-y}As$ over the channel layer;

forming a contact layer above the Schottky layer; the contact layer having a first recess, and the Schottky layer having a second recess aligned with the first recess;

forming a source electrode in ohmic contact with the contact layer;

forming a drain electrode in ohmic contact with the contact layer; and forming a gate electrode in Schottky contact with the Schottky layer.

32. The method recited in claim 31 further comprising forming the transistor with a first doped layer, and a second doped layer.

33. The method recited in claim 32 further comprising forming a ratio of silicon doping concentration approximately 2.5 to 1.5 between the first doped layer and the second doped layer.

* * * * *

UNITED STATES PATENT AND TRADEMARK OFFICE
CERTIFICATE OF CORRECTION

PATENT NO.     : 6,620,662 B2
DATED          : September 16, 2003
INVENTOR(S)    : Hoke et al.

It is certified that error appears in the above-identified patent and that said Letters Patent is hereby corrected as shown below:

<u>Column 3,</u>
Line 2, delete "test" and replace with -- tests --.

<u>Column 4,</u>
Line 12, delete "Group" and replace with -- Groups --.
Lines 19 and 20, delete "Aluminum" and replace with -- aluminum --.
Line 51, delete "layer 34 the" and replace with -- layer 34, the --.
Line 53, delete "32 the" and replace with -- 32, the --.
Line 54, delete "26 grown" and replace with -- 26 is grown --.
Line 54, delete "layer 26 the" and replace with -- layer 26, the --.
Line 56, delete "layer 24 the" and replace with -- layer 24, the --.

<u>Column 5,</u>
Line 47, delete "is s" and replace with -- is --.
Line 55, delete "pulse doped" and replace with -- pulse-doped --.

<u>Column 6,</u>
Line 20, delete "indium is concentration" and replace with -- indium concentration --.
Line 29, delete "pulse doped" and replace with -- pulse-doped --.

<u>Column 7,</u>
Line 18, delete "layer additional" and replace with -- layer's additional --.
Line 28, delete "larger amount" and replace with -- larger amounts --.
Line 41, delete "resistive layer" and replace with -- resistive layers --.

<u>Column 8,</u>
Line 67, delete "is intermediate the" and replace with -- is intermediate to the --.

UNITED STATES PATENT AND TRADEMARK OFFICE
CERTIFICATE OF CORRECTION

PATENT NO. : 6,620,662 B2
DATED : September 16, 2003
INVENTOR(S) : Hoke et al.

It is certified that error appears in the above-identified patent and that said Letters Patent is hereby corrected as shown below:

<u>Column 10,</u>
Line 39, delete "is intermediate the" and replace with -- is intermediate to the --.

Signed and Sealed this

Eighteenth Day of November, 2003

JAMES E. ROGAN
*Director of the United States Patent and Trademark Office*